United States Patent
Connor et al.

(10) Patent No.: US 12,284,796 B2
(45) Date of Patent: Apr. 22, 2025

(54) SPRAY FOAM ELECTROMAGNETIC INTERFERENCE ABSORBER

(71) Applicant: International Business Machines Corporation, Armonk, NY (US)

(72) Inventors: Samuel R. Connor, Apex, NC (US); Eric J. Campbell, Rochester, MN (US); Stuart Brett Benefield, Durham, NC (US); Matthew Doyle, Chatfield, MN (US); Matteo Cocchini, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 784 days.

(21) Appl. No.: 17/447,583

(22) Filed: Sep. 14, 2021

(65) Prior Publication Data

US 2023/0082474 A1    Mar. 16, 2023

(51) Int. Cl.
*H05K 9/00* (2006.01)
*B05B 11/00* (2023.01)
(Continued)

(52) U.S. Cl.
CPC ........ *H05K 9/0081* (2013.01); *B05B 11/0037* (2013.01); *B05B 11/0081* (2013.01);
(Continued)

(58) Field of Classification Search
CPC ................ H05K 9/0081; H05K 9/0015; B05B 11/0037; B05B 11/0081; B05B 17/0623;
(Continued)

(56) References Cited

U.S. PATENT DOCUMENTS

| 3,722,750 A | 3/1973 | Fox |
| 7,204,701 B1 | 4/2007 | Balasingham et al. |

(Continued)

FOREIGN PATENT DOCUMENTS

| JP | 11135978 A | 5/1999 |
| KR | 20010109502 A | 12/2001 |

(Continued)

OTHER PUBLICATIONS

Erickson et al., "EMI Shielding for System in Package using Nozzle-Less Ultrasonic Spray Coating and Silver Particle Free Ink," 2020 International Wafer Level Packaging Conference (IWLPC), 2020, pp. 01-09, doi: 10.23919/IWLPC52010.2020.9375863.

(Continued)

*Primary Examiner* — Michael M. Bernshteyn
(74) *Attorney, Agent, or Firm* — Kelsey M. Skodje

(57) ABSTRACT

A method, a device, and a composition are disclosed. The method includes providing a polyol blend that includes a polyol resin and an electromagnetic (EMA) additive, providing an isocyanate resin selected such that blending the isocyanate resin with the polyol blend results in an EMA spray foam. The device includes a first compartment containing an isocyanate resin and a second compartment containing a polyol blend, which includes a polyol resin and an EMA additive. The composition includes a polyurethane spray foam and an EMA additive blended into the polyurethane spray foam.

20 Claims, 3 Drawing Sheets

(51) Int. Cl.
  *B05B 17/06* (2006.01)
  *C08J 9/00* (2006.01)
  *C08K 9/10* (2006.01)

(52) U.S. Cl.
  CPC ......... *B05B 17/0623* (2013.01); *C08J 9/0066* (2013.01); *C08K 9/10* (2013.01); *C08J 2205/05* (2013.01); *C08J 2205/052* (2013.01); *C08J 2375/06* (2013.01); *C08J 2375/08* (2013.01); *C08K 2201/003* (2013.01); *C08K 2201/01* (2013.01); *H05K 9/0015* (2013.01)

(58) Field of Classification Search
  CPC .................. C08K 9/10; C08K 2201/01; C08K 2201/003; C08J 9/0066; C08J 2205/052; C08J 2205/05; C08J 2375/06; C08J 2375/08
  USPC .......................................... 521/170
  See application file for complete search history.

(56) References Cited

U.S. PATENT DOCUMENTS

| | | | |
|---|---|---|---|
| 7,344,661 B2 | 3/2008 | Kuehl | |
| 2004/0020674 A1 | 2/2004 | McFadden et al. | |
| 2008/0013299 A1 | 1/2008 | Renn | |
| 2021/0122940 A1 | 4/2021 | Sun et al. | |
| 2023/0257548 A1* | 8/2023 | Predtechenskiy | C09D 133/08 524/496 |

FOREIGN PATENT DOCUMENTS

| | | |
|---|---|---|
| KR | 101950779 B1 | 5/2019 |
| KR | 101992570 B1 | 6/2019 |
| WO | 2011081485 A2 | 7/2011 |

OTHER PUBLICATIONS

Eswaraiah et al., "Functionalized Graphene-PVDF Foam Composites for EMI Shielding," https://onlinelibrary.wiley.com/doi/abs/10.1002/mame.201100035, Macromolecular Materials and Engineering, Vole 296, Issue 10, pp. 894-898, published Jun. 3, 2011.

Jia et al., "Graphene Foams for Electromagnetic Interference Shielding: A Review," https://pubs.acs.org/doi/10.1021/acsanm.0c00835, ACS Appl. Nano Mater, 2020, 3, 7, 6140-6155, published Jun. 24, 2020.

Masterbond, "EMI/RFI Shielding Coating," https://www.masterbond.com/applications/emirfi-shielding-coating, printed Jul. 13, 2021, 2 pgs.

Zhan et al., "A carbon nanotube approach for efficient thermally insulating material with high mechanical stability and fire-retardancy," https://pubs.rsc.org/en/content/articlelanding/2020/ra/d0ra03472j#!divAbstract, RSC Advances, Issue 37, 2020, 11 pgs.

Zhang et al., "Lightweight Electromagnetic Interference Shielding Materials and Their Mechanisms," Published: Dec. 2, 2018, DOI: 10.5772/intechopen.82270, https://www.researchgate.net/publication/330942685_Lightweight_Electromagnetic_Interference_Shielding_Materials_and_Their_Mechanisms, 21 pgs.

* cited by examiner

SPRAY FOAM ELECTROMAGNETIC INTERFERENCE ABSORBER

BACKGROUND

The present disclosure relates to electromagnetic interference (EMI) blocking materials and, more specifically, to polyurethane spray foam containing electromagnetic absorber particles.

EMI refers to the deleterious effects electromagnetic (EM) radiation from external sources can have on electrical circuits. For example, EMI in data transfer can increase error rates and cause data loss. Efforts to mitigate EMI include regulating EM emissions and EM compatibility of devices. There are various techniques for reducing EM radiation emitted by a device and for preventing EMI at a susceptible circuit. For example, EMI blocking techniques can include absorbing EMI with conductive and/or magnetic barrier materials.

SUMMARY

Various embodiments are directed to a method that includes providing a polyol blend comprising a polyol resin and an electromagnetic (EMA) additive and providing an isocyanate resin selected such that blending the isocyanate resin with the polyol blend results in an EMA spray foam. The method can also include mixing the isocyanate resin with the polyol blend and dispensing the EMA spray foam on a component of electronic equipment. In some embodiments, the method includes providing a multi-chamber spray canister that has a mixing component and first and second chambers respectively containing the polyol blend and the isocyanate resin. The polyol blend can be mixed by the mixing component. The EMA additive can be selected from graphene particles, carbon fiber, carbon nanotubes, graphite flakes, iron particles, iron oxide particles, titanium dioxide particles, ferrite particles, manganese particles, nickel particles, and cobalt particles. The isocyanate resin can be a resin such as methylene diphenyl diisocyanate (MDI), hexamethylene diisocyanate (HDI), toluene diisocyanate, hydrogenated MDI, isophorone diisocyanate, naphthalene diisocyanate, HDI biuret, or HDI isocyanurate. The polyol may be a diol, a triol, a polyol, a polyether polyol, a polyester polyol, a polycarbonate polyol, a graft polyol, a polycaprolactone polyol, a polybutadiene polyol, or a polysulfide polyol. An additional additive, such as a blowing agent, a crosslinker, a chain extender, a dye, a flame retardant, a curing agent, a catalyst, a stabilizer, a filler, and/or a surfactant, may also be included in the polyol blend. In some embodiments, the EMA additive is surrounded by a surface component such as a carbon coating, a hydrophobic shell, reactive functional groups, or flame retardant molecules.

The device includes a first compartment containing an isocyanate resin and a second compartment containing a polyol blend, which includes a polyol resin and an EMA additive. The device can also include a mixing component, which can include an ultrasonic horn. The compartments can be chambers in a multi-chamber spray canister, which can also include a dispensing component.

The composition includes a polyurethane spray foam and an EMA additive blended into the polyurethane spray foam. The polyurethane spray foam may be an open-cell foam, a closed-cell foam, or a low expansion foam. The EMA additive can be selected from graphene particles, carbon fiber, carbon nanotubes, graphite flakes, iron particles, iron oxide particles, titanium dioxide particles, ferrite particles, manganese particles, nickel particles, and cobalt particles. In some embodiments, the EMA additive is surrounded by a surface component such as a carbon coating, a hydrophobic shell, reactive functional groups, or flame retardant molecules. Starting materials for forming the polyurethane spray foam can include a polyol and an isocyanate resin such as methylene diphenyl diisocyanate (MDI), hexamethylene diisocyanate (HDI), toluene diisocyanate, hydrogenated MDI, isophorone diisocyanate, naphthalene diisocyanate, HDI biuret, or HDI isocyanurate.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
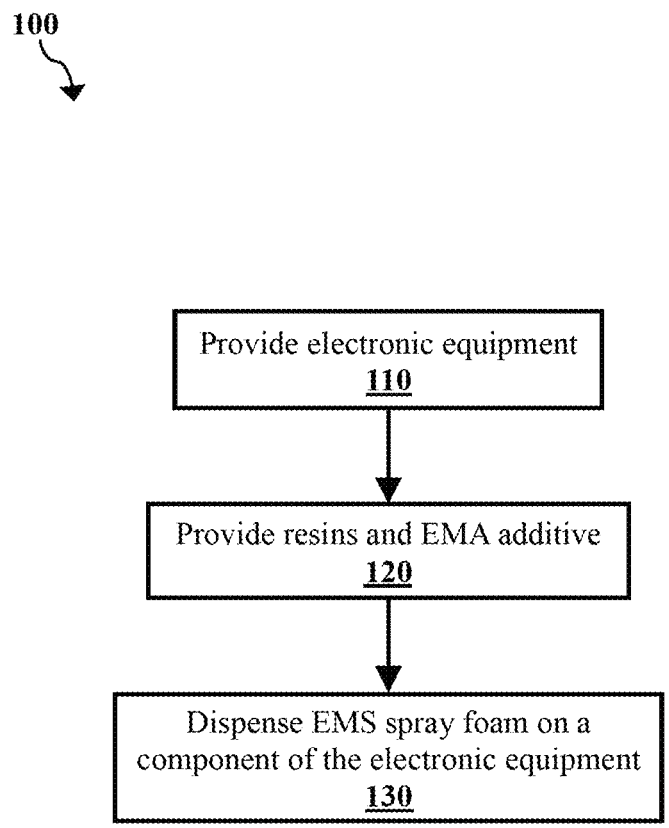
FIG. 1 is a flow diagram illustrating a process of preparing and depositing an EMA spray foam on electronic equipment, according to some embodiments of the present disclosure.

While the invention is amenable to various modifications and alternative forms, specifics thereof have been shown by way of example in the drawings, and will be described in detail. It should be understood, however, that the intention is not to limit the invention to the particular embodiments described. Instead, the intention is to cover all modifications, equivalents, and alternatives falling within the spirit and scope of the invention.

DETAILED DESCRIPTION

Embodiments of the present disclosure are generally directed to electromagnetic interference (EMI) blocking materials and, more specifically, to polyurethane spray foam containing electromagnetic absorber particles. Embodiments of the present disclosure can include a device for mixing and dispensing the spray foam. While the present disclosure is not necessarily limited to such applications, various aspects of the disclosure may be appreciated through a discussion of examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. Further, the word "providing" as used herein can refer to various actions such as creating, purchasing, obtaining, synthesizing, making available, etc. or combinations thereof.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Unless otherwise noted, chemical reactions are performed at ambient conditions or under slight heating with no special atmosphere or head space, and may be performed using standard organic solvents to manage mix properties such as viscosity and flow index. Standard procedures for quenching reactions, solvent removal, and purification are performed. Room temperature is between about 15° C. and 30° C. unless otherwise indicated.

Ranges (e.g., time, concentration, temperature, etc.) indicated herein include both endpoints and all numbers between the endpoints. Unless specified otherwise, the use of a tilde (—) or terms such as "about," "substantially," "approximately," "slightly less than," and variations thereof are intended to include the degree of error associated with measurement of the particular quantity based upon the equipment available at the time of filing the application. For example, "about" can include a range of ±8% or 5%, or 2% of a given value, range of values, or endpoints of one or more ranges of values. Unless otherwise indicated, the use of terms such as these in connection with a range applies to both ends of the range (e.g., "approximately 1 g-5 g" should be interpreted as "approximately 1 g-approximately 5 g") and, in connection with a list of ranges, applies to each range in the list (e.g., "about 1 g-5 g, 5 g-10 g, etc." should be interpreted as "about 1 g-about 5 g, about 5 g-about 10 g, etc.").

Turning now to an overview of technologies that are more specifically relevant to aspects of the present disclosure, in general, EMI refers to the deleterious effects electromagnetic (EM) radiation from external sources can have on electrical circuits. One example of EMI is radio frequency interference (RFI), which includes electromagnetic currents within a range of about 3 kHz-300 GHz. However, EMI can occur at any frequency (e.g., about 217 Hz, about 2 kHz-150 kHz, >300 GHz, etc.). EMI in data transfer can increase error rates and cause data loss. Efforts to mitigate EMI include regulating EM emissions and EM compatibility of devices. There are various techniques for reducing EM radiation emitted by a device and for preventing EMI at a susceptible circuit.

For example, barriers that include EM absorber materials (e.g., conductive and/or magnetic materials) can be used to block EM radiation. EM absorbers can be used to convert EM radiation to heat, which then dissipates from the absorber. Examples of EMI barriers can include copper tape, flexible or flat sheets of a conductive elastomer such as rubber, silicone, epoxy, polyurethane, etc., ferrite tiles, and pyramidal or egg carton shaped structures. EMI barriers such as these can be positioned on or near circuit board components, connectors, cables, etc., and affixed with an adhesive layer (e.g., a pressure sensitive adhesive). Additional EMI barriers can include specialized components such as gaskets designed to block EMI at connectors.

As data transfer rates increase, protection from EMI becomes even more important. However, existing EMI barriers are not appropriate for many small, inaccessible, and/or irregularly shaped components. For example, they can be difficult or impossible to install and may not sufficiently block/absorb radiation when there is limited surface area for adhesion. Additionally, producing specialized components such as EMI blocking gaskets can be expensive and impractical. Solutions such as these are also difficult to implement in devices that have already been fully assembled and installed. However, even the smallest gaps left by existing EMI absorbers may allow higher frequency EMI (e.g., greater than about 500 MHz) through. Thus, there is a need for EMI barriers that can conform and adhere to a greater variety of surfaces, fill gaps, and be easily installed without dismantling a device and without short-circuiting nearby pins and conductors.

Embodiments of the present disclosure include electromagnetic absorber (EMA) materials that can be applied as a spray foam, also referred to herein as an EMA spray foam. Additional embodiments include a device for dispensing the EMA spray foam. The device can include a spray canister with a mixing component such as an ultrasonic horn or static mixer. Embodiments of the present disclosure also include methods of forming EMA spray foam. In some embodiments, the EMA spray foam can coat flat, curved, and irregularly shaped surfaces and permits installation of EMI shielding in otherwise difficult spaces. The EMA spray foam can be a polyurethane (PU) spray foam blended with at least one type of EMA additive. The EMA additive can be a magnetic and/or conductive filler material, such as metallic particles, graphene, carbon nanotubes, ferrite, titanium dioxide, etc. For example, EMA particles can be mixed into a polyol resin. When the polyol resin mixture is combined with an isocyanate resin, a PU foam containing the particles or other EMA additives can form and be dispensed onto a surface (e.g., by spraying from an aerosol can). In some embodiments, EMA particle additives can be surface-modified with components for preventing agglomeration, binding to polyurethane, imparting flame-retardancy, etc. Other surface components on/surrounding EMA particles can include hydrophobic shells, carbon coatings, etc.

Figure 2A:
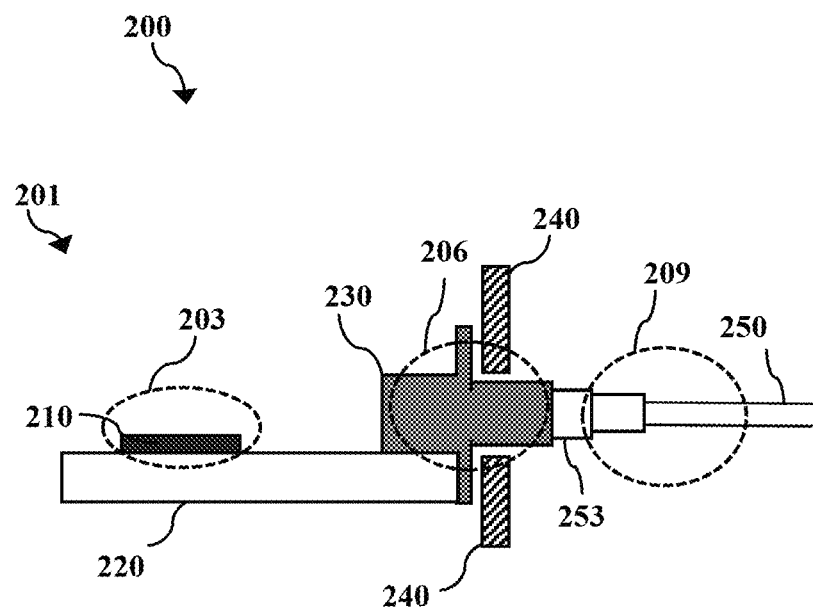
FIG. 2A is a schematic diagram illustrating electronic equipment with regions of EMI sensitivity and/or EMI emission, according to some embodiments of the present disclosure.
Figure 2B:
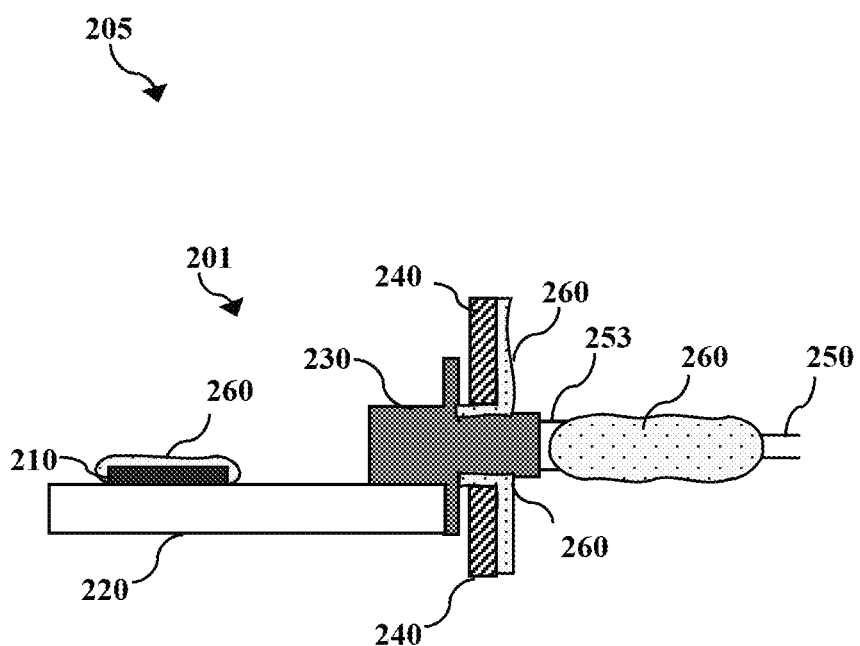
FIG. 2B is a schematic diagram illustrating electronic equipment and EMA spray foam, according to some embodiments of the present disclosure.
Figure 3:
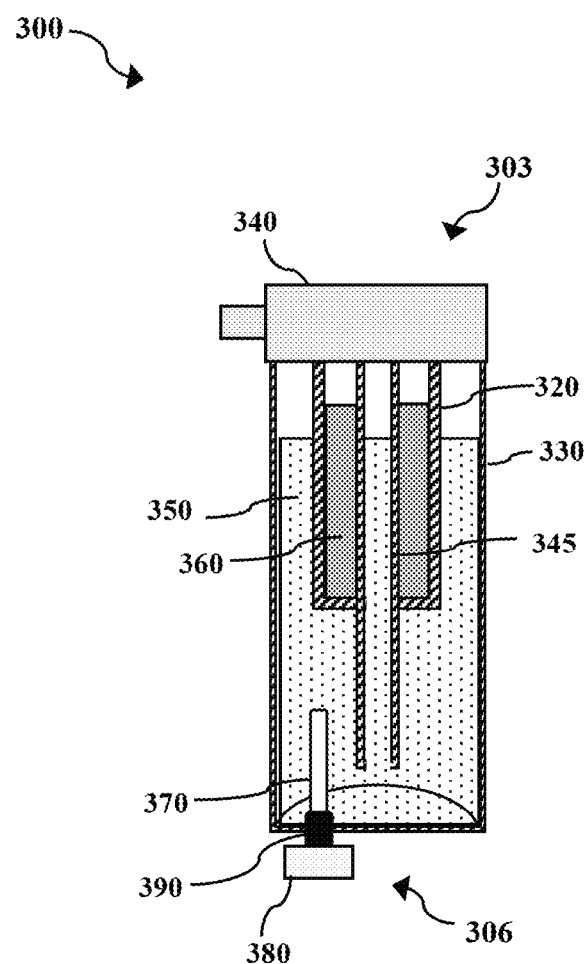
FIG. 3 is a schematic diagram illustrating an EMA spray foam dispenser, according to some embodiments of the present disclosure.

Referring now to the drawings, in which like numerals represent the same or similar elements, FIG. 1 is flow diagram illustrating preparation and deposition of an EMA spray foam, FIGS. 2A and 2B are schematic diagrams illustrating, respectively, electronic equipment and electronic equipment with EMA spray foam deposited thereon. FIG. 3 is a schematic diagram illustrating an EMA spray foam dispenser.

FIG. 1 is a flow diagram illustrating a process 100 of preparing an EMI and dispensing an EMI absorbing foam on electronic equipment, according to some embodiments of the present disclosure. At least one item of electronic equipment is provided. This is illustrated at operation 110. Examples of electronic equipment may include printed circuit board (PCB) assemblies, semiconductor devices, power semiconductor devices, transistors (e.g., field effect transistors), optoelectronics, capacitors, resistors, chip carriers, computing devices (e.g., desktop or laptop computers, servers, mobile computing devices, etc.), power supplies, cables and/or connectors (e.g., high definition multimedia interface (HDMI), digital visual interface (DVI), serial connectors, universal serial bus (USB), coaxial cables, communications cables, etc.), central processing units (CPUs), graphics processing units (GPUs), home appliances, automobile parts, etc. However, the electronic equipment can include any item or set of items that may emit EMI and/or be affected by EMI from an external source.

Resins for forming a spray foam and electromagnetic absorber (EMA) additives are provided. This is illustrated at operation 120. The spray foam can be a polyurethane spray foam. However, other spray foams known to those of ordinary skill in the art may be used in some embodiments. The PU spray foam can be prepared by mixing a polyol resin, an isocyanate resin, and conductive and/or magnetic additives (referred to herein as "EMA additives"), such as magnetic nanoparticles, metallic particles, graphene, carbon nanotubes, ferrite, titanium dioxide, etc. The selection of resins can be used to tune properties of polyurethane spray foam such as softness, elasticity, rigidity, UV resistance, electrical or thermal conductivity, etc. Examples of polyols and isocyanates that may be used are discussed in greater detail below.

A mixture of EMA additives and a resin is prepared. For example, the EMA additives can be mixed with the polyol. This polyol blend is then mixed with an isocyanate resin prior to or during dispensation. Mixing, dispensing, and curing the resulting foam can be carried out using any appropriate techniques for producing and dispensing polyurethane spray foam known to those of ordinary skill in the art. Examples can include techniques for forming various types of spray foam, such as open-cell foam, closed-cell foam, low-expansion foam, etc. Containers and/or compartments for storing the polyol blend and isocyanate resin may include mixing components for dispersing the EMI particles throughout the polyol blend and/or mixing the polyol blend and isocyanate resin (e.g., a static mixing tube, a dynamic mixing tube, a rotary mixer, an ultrasonic horn, etc.). This is discussed in greater detail with respect to FIG. 3.

In some embodiments, the polyol blend and isocyanate resin are stored separately prior to dispensation. For example, the isocyanate resin can be in a first chamber of a multi-chamber spray canister and the polyol blend can be in a second chamber of the same multi-chamber spray canister. The polyol blend and isocyanate resin can mix as they are dispensed through the nozzle of the canister or in a mixing compartment prior to dispensation. The polyol blend and isocyanate resin may also be stored in separate containers that can be connected to a dispenser in which mixing can occur. The dispenser may include a mixing compartment in some embodiments. In other embodiments, the polyol blend and isocyanate resin can be stored in a single compartment spray canister (e.g., a conventional aerosol canister). This substantially unreacted mixture of polyol blend and isocyanate resin produces a foam and cures in the presence of air after being released from the canister.

EMA additives can be selected based on various electrical and/or magnetic properties (e.g., permittivity, permeability, electrical resistance, magnetoresistance, etc.), as will be understood by persons of ordinary skill in the art. Examples of EMA additives that may be used can include graphene particles, carbon fiber, carbon nanotubes, graphite flakes, iron particles, iron oxide particles, titanium dioxide particles, or other electromagnetic absorber particles (e.g., particles of ferrite, manganese, nickel, cobalt, etc.). The type and percentage of EMA additives in the PU spray foam can be selected based on criteria such as level of EM radiation exposure/emission, EMI frequency, type of equipment, etc. As will be understood by persons of ordinary skill in the art, the percentage of EMA additives incorporated into a foam should be below a threshold (percolation threshold) for causing a short circuit when in contact with the electronic equipment. For example, the percolation threshold can depend on the size and aspect ratio of EMA particles. The EMA additives can be any shape or size appropriate for mixing into a spray foam. EMA additive particles may have diameters of approximately 1 nm-5 mm and ranges therein. For example, the particles can have an average diameter of approximately 100 μm, 45 μm, 20 μm, <1 μm-10 μm, etc.

In some embodiments, EMA additive particles can have surface components (e.g., surface-modifying functional groups, shells, coatings, etc.) and/or encapsulants. In some embodiments, the particle surfaces can be modified/coated with a component for preventing agglomeration. For example, carbon coating can be used to reduce surface tension between particles and the polyol resin. A hydrophobic polymer shell or small molecule shell can also prevent agglomeration. In some embodiments, the particles include magnetic iron oxide nanoparticle cores surrounded by a shell, which can prevent oxidation and agglomeration of the iron oxide particles while preserving their electromagnetic properties. These particles can have structures such as core-shell, matrix, and shell$_a$-core-shell$_b$, etc. The shells can be made of surfactants, small molecules, polymers, silica, etc.

Surface modifications may also include small molecules or polymers that impart additional functionalities such as flame retardancy (e.g., organophosphorus or organobromide moieties). The particle surfaces may also be modified to include ligands with reactive functional groups capable of binding to and/or crosslinking the polyurethane chain. Examples of reactive functional groups can include hydroxyl, isocyanate, carboxylic acid, thiol, aldehydes, etc. Techniques known to those of ordinary skill in the art can be used to carry out the surface modifications (e.g., layer-by-layer technology).

Polyols that may be used to form EMI absorber polyurethane foam can be diols, triols, or alcohols with more than three hydroxyl groups. Examples of polyols can include polyether polyols, polyester polyols, polycarbonate polyols, graft polyols, polycaprolactone polyols, polybutadiene polyols, polysulfide polyols, polyols derived from vegetable oils, etc. In some embodiments, the polyols can have additional functional groups, such as esters, ethers, amides, acrylates, metals, metalloids, etc. Examples of functional groups are discussed in greater detail below. The size and structure of the polyol can affect the properties of the resulting polyurethane. For example, a greater number of functional groups can provide a higher degree of cross-linking and a more dense, rigid foam.

Examples of isocyanate resins that can be used may include di-, tri-, or polyisocyanate monomers, isocyanate polymers, isocyanate functional prepolymers, isocyanate-alcohol adducts, and isocyanurate trimers. In some embodiments, the isocyanate resin can be an isocyanate such as methylene diphenyl diisocyanate (MDI), toluene diisocyanate (TDI), hydrogenated MDI (HMDI), isophorone diisocyanate, naphthalene diisocyanate, hexamethylene diisocyanate (HDI), HDI biuret, HDI isocyanurate, etc.

The EMA spray foam can have other additives in some embodiments. For example, various additives can be added to the polyol blend. Examples of these can include surfactants, blowing agents (e.g., carbon dioxide ($CO_2$), pentane, hydrazine, 1,1,1,2-tetrafluoroethane, 1,1,1,3,3-pentafluoropropane, etc.), dyes, pigments, plasticizers, stabilizers, fillers, catalysts, curing agents, flame retardants, etc. In some embodiments, additives can include crosslinkers and/or chain extenders such as ethylene glycol, di- or triethylene glycol, propylene glycol, di- or tripropylene glycol, 1,3-propanediol, 1,3- or 1,4-butanediol, neopenyl glycol, 1,6-hexanediol, 1,4-cyclohexanedimethanol, hydroquinone bis (2-hydroxyethyl) ether, ethanolamine, di- or triethanolamine, methyldiethanolamine, phenyldiethanolamine, glycerol, trimethylolpropane, 1,2,6-hexanetriol, pentaerythritol, N,N,N',N'-tetrakis-(2-hydroxypropyl)ethylenediamine; diethyl-toluenediamine, dimethyl-thio-toluenediamine, etc.

The EMA spray foam is then dispensed at a selected location on the electronic equipment. This is illustrated at operation 130. In some embodiments, the location is selected based on EMI testing. For example, EMI testing may show that a particular PCB assembly component, such as an integrated circuit (IC), is emitting significant EM radiation. The spray foam can be applied on or around this component. For example, spray foam can be applied over an IC, a connector, a cable, etc. (see, e.g., FIG. 2B). The spray foam can be used to supplement other EMI shields and/or absorbers in some embodiments. For example, a layer of the spray foam may be deposited on the surface of, or gaps surrounding, an EMI shielding structure, EMI absorber sheet, EMI absorber gasket, etc. The spray foam may also be used to fill in gaps in a device's housing.

FIG. 2A is a schematic diagram 200 illustrating electronic equipment 201 with regions 203, 206, and 209 of relatively high sensitivity to EMI and/or relatively high levels of EMI emission, according to some embodiments of the present disclosure. Herein, these regions are referred to as "EMI regions" and are represented by dashed-line ovals. These ovals illustrate approximate locations that may have higher levels of EMI emission and/or susceptibility than other regions/components of the electronic equipment 201. The EMI regions can also be defined as having EMI emissions over a given threshold, e.g., a threshold defined by electromagnetic compatibility (EMC) regulations.

The dashed-line ovals represent a first EMI region 203 at a microprocessor 210 mounted on a PCB 220, a second EMI region 206 at a connector 230 mounted on the PCB 220, and a third EMI region 209 at a cable 250 with a plug 253 plugged into the connector 230. The connector 230 extends through an opening in a housing 240 and is a cable/wire-to-board connector. However, in other embodiments, there can be at least one board-to-board, cable/wire-to-cable/wire connector, etc. Only a cross-sectional portion of the housing 240 surrounding the connector is illustrated, but the housing 240 can surround at least a portion of the PCB 220 and can be any appropriate housing for an electronic device. In some embodiments, the housing 240 can be a barrier to EM radiation. For example, the housing 240 can be made out of a conductive material and/or have one or more EMI absorbing sheets (not shown) affixed to its surface.

It will be understood by those of ordinary skill in the art that the dashed-line ovals are for illustrative purposes and do not represent precise boundaries/locations. EMI regions can be any region with a high current (e.g., a high current relative to other equipment 201 regions). This can depend on the frequency of the current and the size/shape of the structure through which the current flows. In one example, an EMI region may extend down the length of the cable 250 (not shown) and/or be localized around at least one plug or socket. The positions of EMI regions can depend on various factors, such as type of equipment, age of equipment, external environment, etc. The electronic equipment 201 may have at least one EMI region (not shown) in addition to EMI regions 203, 206, and 209. EMI regions can also be regions that are particularly sensitive to EMI.

There can also be at least one additional EMI barrier (not shown) such as a specialized gasket for the connector 230, an EMI absorber sheet affixed to a surface on the housing 240 and/or the microprocessor 210, an EMI absorber tube or tape around the cable 250, etc. Examples of additional EMI barriers are discussed in greater detail with respect to FIG. 1. Further, the electronic equipment 201 can be a portion of a device or devices with additional components (not shown). For example, there can be various components mounted on the PCB 220 in addition to the microprocessor 210 and connector 230. The components on the PCB 220 can be consistent with any PCB assembly (e.g., semiconductor devices, semiconductors, transistors, optoelectronics, capacitors, resistors, chip carriers, etc.). In some embodiments, at least one of the additional components is associated with an additional EMI region and/or an EMI region illustrated in FIG. 2A (EMI regions 203, 206, and/or 209).

FIG. 2B is a schematic diagram 205 illustrating electronic equipment 201 with EMA spray foam 260, according to some embodiments of the present disclosure. Where elements referred to in FIG. 2B are the same as elements shown in FIG. 2A, the same reference numbers are used.

The EMA spray foam 260 can be produced and deposited via techniques such as those discussed in greater detail with respect to process 100 (FIG. 1). FIG. 2B illustrates EMA spray foam 260 deposited on the electronic equipment 201 at EMI regions 203, 206, and 209 (illustrated in FIG. 2A). More specifically, portions of EMA spray foam 260 are shown on the microprocessor 210, the connector 230 and housing 240, and the cable 250 and plug 253. However, the EMA spray foam 260 may be applied in additional locations and/or omitted from a location shown in the figure. Herein, a cross-sectional view of the EMA spray foam 260 over the top and two sides of the microprocessor 210 is shown for illustrative purposes. However, the EMA spray foam 260 may be deposited to coat any appropriate surface of the microprocessor 210 (e.g., the top and all sides, only the top, etc.).

On the connector 230 and housing 240, the spray foam 260 substantially fills gaps between the body of the connector 230 and edges of the housing 240 walls at the opening. This portion of spray foam 260 also coats exterior surfaces of the housing 240. A cross-sectional side view of the housing 240 is illustrated, but it should be noted that the EMA spray foam 260 may be deposited in gaps at the sides of the connector 230 in addition to the top and bottom as illustrated in FIG. 2B. In other embodiments, EMA spray foam 260 is not deposited in the gaps. As will be understood by persons of ordinary skill, there can be more or less of the EMA spray foam 260 deposited at each location. For example, EMA spray foam 260 may be deposited on other surfaces of the connector 230 (e.g., on the body of the connector 230 over the PCB 220) and/or housing (e.g., on an interior surface of the housing). In another example, there may be EMA spray foam 260 deposited on only the connector 230 or only the housing 240. The EMA spray foam 260 can optionally coat additional interior and/or exterior surfaces (not shown) of the housing 240 in some embodiments.

The EMA spray foam 260 can be deposited on the cable 250 and plug 253 on all sides or around the circumference of a round cable 250 and/or plug 253. The EMA spray foam 260 may coat a larger or smaller surface of the plug 253 and cable 250 than what is illustrated in FIG. 2B. For example, the EMA spray foam 260 may coat a larger or smaller portion of the cable 250. In some embodiments, the spray foam 260 coats the entire length of the cable 250. There may also be EMA spray foam 260 on only the cable 250 or only the plug 253 in other embodiments. Additionally, there can be spray foam 260 on a plug or socket at the other end of the cable 250 (not shown).

The amount of EMA spray foam 260 required to reach a sufficient level of attenuation can depend on the structure of the electronic equipment 201 and the amount of EMI. For example, users can monitor attenuation and apply more spray foam until EMI is sufficiently attenuated and/or the available spaces in the EMI regions 203, 206, and 209 are filled.

FIG. 3 illustrates a schematic diagram 300 of an EMA spray foam dispenser 303 with an ultrasonic mixing component 306, according to some embodiments of the present disclosure. The EMA spray foam dispenser 303 ("foam dispenser 303") can be a multi-chamber spray canister that includes an inner chamber 320, an outer chamber 330, and a component 340 for mixing and dispensing EMA spray foam ("dispensing component 340") via a nozzle (e.g., a mixing nozzle). Examples of multi-chamber spray canisters that may be used are discussed in greater detail with respect to operation 130 of process 100 (FIG. 1).

The dispensing component 340 is connected to a dip tube 345 that extends through the inner chamber 320 and into the outer chamber 330. The outer chamber 330 contains a polyol blend 350, which contains polyol and EMA additives, and the inner chamber 320 contains an isocyanate resin 360. The polyol blend 350 may also include additional additives such as those discussed with respect to operation 120 of process 100. Until the EMA spray foam is to be dispensed, the polyol blend 350 can enter the dip tube 345 while remaining isolated from the isocyanate resin 360. When dispensing spray foam, a mixture of polyol blend 350 and isocyanate resin 360 can be formed in the dispensing component 340 (e.g., in a mixing chamber, valve housing, nozzle, etc.). This is not illustrated herein. However, examples of equipment for mixing and dispensing spray foams from canisters that may be used are known to persons of ordinary skill in the art.

The illustrated ultrasonic mixing component 306 is connected to the foam dispenser 303 at the bottom of the outer chamber 330. However, the ultrasonic mixing component 306 may be connected at another location on the bottom or sides of the outer chamber 330. The ultrasonic mixing component 306 can include an ultrasonic horn 370 and external transducer 380 connected via a connector 390 that extends through a wall of the outer chamber 330. In some embodiments, the transducer 380 can be removed from the ultrasonic mixing component 306 and reused. The connector 390 can be a threaded connector or any conventional airtight connector appropriate for a canister. The ultrasonic horn 370 can have an input end extending into the polyol blend 350 and an output end connected to the transducer 380 via the connector 390.

Ultrasonic waves are transmitted from the transducer 380 to the input end of the ultrasonic horn 370. Propagation of these waves through the polyol blend 350 can cause the EMA additives to disperse so that they are evenly distributed throughout the polyol blend 350 and, therefore, the EMA spray foam that forms upon mixing with the isocyanate resin 360. Various types of ultrasonic mixing components 306 that may be used are known to those of ordinary skill in the art. Further, it will be understood that in other embodiments an ultrasonic mixing component 306 may be connected to a different type of EMA spray foam container (e.g., a single chamber spray can, a polyol blend container connected to a mixer/dispenser, etc.).

The processes discussed herein, and their accompanying drawings, are not to be construed as limiting. One skilled in the art would recognize that a variety of techniques may be used that vary in conditions, components, methods, etc., which ultimately result in EMA spray foam. In addition, the conditions can optionally be changed over the course of a process. Further, in some embodiments processes can be added, omitted, or carried out in alternate orders (e.g., reversing operations 110 and 120 of process 100 illustrated in FIG. 1), while still remaining within the scope of the disclosure, as will be understood by a person of ordinary skill in the art. It should also be noted that processes can be carried out by a single entity, or by multiple entities. For example, a first entity may produce the EMA spray foam, and a second entity may mix and deposit the spray foam onto electronic equipment (e.g., via a multi-chamber canister).

Examples of moieties that may be included in the compounds/surface components (e.g., surface-bound reactive functional groups, flame retardant molecules, etc.) illustrated herein can include epoxides, hydroxyl, propylene carbonate, alkyl halides, esters, amines, isocyanates, acid chlorides, chloroformates, alkyls, alkenes, alkynes, etc. Herein, "alkyl" refers to $C_1$-$C_{100}$ radicals, which can be linear, branched, or cyclic. Examples of alkyl groups can include methyl, ethyl, n-propyl, iso-propyl, n-butyl, iso-butyl, sec-butyl, tert-butyl, pentyl, hexyl, octyl, cyclopropyl, cyclobutyl, cyclopentyl, cyclohexyl, cyclooctyl. Organic materials illustrated herein can also have substituted analogues of cyclic alkyl groups. When cyclic, the alkyl groups can be aromatic or non-aromatic. Herein, the term "aromatic" also refers to pseudoaromatic heterocycles, which are heterocyclic substituents that have similar properties and structures (nearly planar) to aromatic heterocyclic ligands, but are not by definition aromatic. Examples of cyclic aromatic alkyls that can be used can include six-carbon aromatic rings (phenyl) and substituted variants thereof (e.g. 2-methyl-phenyl, xylyl, tolyl, etc.), $C_4$-$C_{60}$ aromatic rings, $C_4$-$C_{20}$ aromatic rings, etc. The cyclic groups can optionally include heteroatoms (e.g., nitrogen, oxygen, or sulfur) replacing at least one carbon atom in the cyclic structure.

The compounds described herein can contain one or more chiral centers. Unless otherwise noted, the disclosed structures cover all stereoisomers, conformers, rotamers, isomers, and enantiomers of the represented compounds. Further, polymers or other materials containing the disclosed compounds can include racemic forms of the compounds in addition to individual stereoisomers, as well as mixtures containing any of these. Substituents on the compounds described herein may participate in additional chemical reactions, transformations, or interactions, which can include synthesis, decomposition, single and/or double replacement, oxidation/reduction, acid/base, nucleophilic, electrophilic substitutions, radical substitutions, addition/elimination reactions, crosslinking reactions, and polymerization reactions.

Where isomers of a named alkyl, alkenyl, alkoxy, aryl, or other functional group exist (e.g., n-butyl, iso-butyl, sec-butyl, and tert-butyl), reference to a member of the group without specifying a particular isomer (e.g., butyl) is intended to include all isomers in the family (e.g., n-butyl, iso-butyl, sec-butyl, and tert-butyl). Further, unless specified otherwise, reference to one member of the group (e.g., n-butyl) includes the remaining isomers in the family (e.g., iso-butyl, sec-butyl, and tert-butyl).

Additionally, compounds described herein in terms of listed elements (e.g., SiN, or SiGe) can include different proportions of the elements within the compound, e.g., SiGe includes $Si_xGe_{(1-x)}$ where x is less than or equal to 1, and the like. Further, other elements can be included in a compound and still function in accordance with the present principles.

What is claimed is:

1. A method, comprising:
   providing a polyol blend, the polyol blend comprising:
      a polyol resin; and
      electromagnetic absorber (EMA) particles with hydrophobic surface modifiers; and
   providing an isocyanate resin selected such that blending the isocyanate resin with the polyol blend results in an EMA spray foam.

2. The method of claim 1, further comprising:
   providing electronic equipment;
   mixing the isocyanate resin with the polyol blend; and
   dispensing the EMA spray foam on a component of the electronic equipment.

3. The method of claim 2, wherein the mixing comprises:
   providing a multi-chamber spray canister comprising:
      a first chamber containing the polyol blend;
      a second chamber containing the isocyanate resin; and
      a mixing component; and
   mixing the polyol blend in the first chamber of the multi-chamber spray canister with the mixing component.

4. The method of claim 1, wherein the EMA particles are selected from the group consisting of graphene particles, iron particles, iron oxide particles, titanium dioxide particles, ferrite particles, manganese particles, nickel particles, and cobalt particles.

5. The method of claim 1, wherein the isocyanate resin is selected from the group consisting of methylene diphenyl diisocyanate (MDI), hexamethylene diisocyanate (HDI), toluene diisocyanate, hydrogenated MDI, isophorone diisocyanate, naphthalene diisocyanate, HDI biuret, and HDI isocyanurate.

6. The method of claim 1, wherein the polyol resin is selected from the group consisting of a diol, a triol, a polyol, a polyether polyol, a polyester polyol, a polycarbonate polyol, a graft polyol, a polycaprolactone polyol, a polybutadiene polyol, and a polysulfide polyol.

7. The method of claim 1, wherein the polyol blend further comprises an additive selected from the group consisting of a blowing agent, a crosslinker, a chain extender, a dye, a flame retardant, a curing agent, a catalyst, a stabilizer, a filler, and a surfactant.

8. The method of claim 1, wherein the providing the polyol blend further comprises forming the EMA particles, wherein the forming comprises:
   providing the EMA particles; and
   modifying surfaces of the EMA particles.

9. The method of claim 1, wherein the surface modifiers are selected from the group consisting of a carbon coating, a hydrophobic polymer shell, and a hydrophobic small molecule shell.

10. A composition, comprising:
    a polyurethane spray foam; and
    electromagnetic (EMA) particles with hydrophobic surface modifiers blended into the polyurethane spray foam.

11. The composition of claim 10, wherein the polyurethane spray foam is a polyurethane foam selected from the group consisting of an open-cell foam, a closed-cell foam, and a low expansion foam.

12. The composition of claim 10, wherein the EMA particles are selected from the group consisting of graphene particles, iron particles, iron oxide particles, titanium dioxide particles, ferrite particles, manganese particles, nickel particles, and cobalt particles.

13. The composition of claim 10, wherein the surface modifiers are selected from the group consisting of a carbon coating, a hydrophobic polymer shell, and a hydrophobic small molecule shell.

14. The composition of claim 10, wherein the polyurethane spray foam is formed from starting materials comprising:
    a polyol; and
    an isocyanate resin is selected from the group consisting of methylene diphenyl diisocyanate (MDI), hexamethylene diisocyanate (HDI), toluene diisocyanate, hydrogenated MDI, isophorone diisocyanate, naphthalene diisocyanate, HDI biuret, and HDI isocyanurate.

15. The method of claim 1, wherein the EMA spray foam is a polyurethane foam selected from the group consisting of an open-cell foam, a closed-cell foam, and a low-expansion foam.

16. The method of claim 1, wherein the EMA particles are magnetic.

17. The method of claim 1, wherein the EMA particles are particles of a material that converts electromagnetic radiation into heat.

18. The method of claim 2, wherein the dispensed EMA foam is able to fill gaps in a housing of the electronic equipment.

19. The method of claim 2, wherein the component is selected in response to determining that the component emits more than a threshold amount of electromagnetic radiation.

20. The method of claim 3, wherein the mixing component comprises an ultrasonic horn.

* * * * *